(12) United States Patent
Ritter et al.

(10) Patent No.: US 10,546,816 B2
(45) Date of Patent: Jan. 28, 2020

(54) SEMICONDUCTOR SUBSTRATE WITH ELECTRICALLY ISOLATING DIELECTRIC PARTITION

(71) Applicant: Nexperia B.V., Nijmegen (NL)

(72) Inventors: Hans-Martin Ritter, Nahe (DE); Joachim Utzig, Hamburg (DE); Frank Burmeister, Langenhagen (DE); Godfried Henricus Josephus Notermans, Hamburg (DE); Jochen Wynants, Hamburg (DE); Rainer Mintzlaff, Reinbek (DE)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 15/356,527

(22) Filed: Nov. 18, 2016

(65) Prior Publication Data

US 2017/0170122 A1   Jun. 15, 2017
US 2018/0166388 A9   Jun. 14, 2018

(30) Foreign Application Priority Data

Dec. 15, 2015   (EP) ..................................... 15200095

(51) Int. Cl.
*H01L 23/538*   (2006.01)
*H01L 21/78*   (2006.01)
(Continued)

(52) U.S. Cl.
CPC .......... *H01L 23/5386* (2013.01); *H01L 21/78* (2013.01); *H01L 23/291* (2013.01); *H01L 23/3171* (2013.01); *H01L 23/3192* (2013.01); *H01L 29/0649* (2013.01); *H01L 29/2003* (2013.01); *H01L 29/205* (2013.01); *H01L 29/872* (2013.01)

(58) Field of Classification Search
CPC .......... H01L 29/0649; H01L 21/76264; H01L 21/76283; H01L 21/76898; H01L 21/76; H01L 21/76224; H01L 21/78; H01L 23/5386
See application file for complete search history.

(56) References Cited

U.S. PATENT DOCUMENTS 5,064,771 A * 11/1991 Solomon .................. H01L 21/76
148/DIG. 135
5,381,033 A * 1/1995 Matsuzaki .......... H01L 21/7624
257/374

(Continued)

FOREIGN PATENT DOCUMENTS

DE   198 06 819 A1   8/1999

OTHER PUBLICATIONS

Extended European Search Report for Patent Appln. No. 15200095.6 (dated Jun. 8, 2016).

*Primary Examiner* — Cuong Q Nguyen
*Assistant Examiner* — Shih Tsun A Chou
(74) *Attorney, Agent, or Firm* — Ohlandt, Greeley, Ruggiero & Perle, L.L.P.

(57) ABSTRACT

A semiconductor device and a method of making the same. The device includes a substrate comprising a major surface and a backside. The device also includes a dielectric partition for electrically isolating a first part of the substrate from a second part of the substrate. The dielectric partition extends through the substrate from the major surface to the backside.

12 Claims, 5 Drawing Sheets

(51) Int. Cl.
  *H01L 23/29* (2006.01)
  *H01L 29/872* (2006.01)
  *H01L 29/20* (2006.01)
  *H01L 23/31* (2006.01)
  *H01L 29/205* (2006.01)
  *H01L 29/06* (2006.01)

(56) References Cited

U.S. PATENT DOCUMENTS

| | | | | |
|---|---|---|---|---|
| 5,661,329 A | * | 8/1997 | Hiramoto | H01L 21/84 257/347 |
| 5,767,561 A | * | 6/1998 | Frei | H01L 21/762 257/296 |
| 6,787,874 B2 | * | 9/2004 | Ootera | H01L 21/762 257/499 |
| 7,560,802 B2 | * | 7/2009 | Kalvesten | B81B 7/0006 257/621 |
| 7,875,509 B2 | * | 1/2011 | Sakano | H01L 29/0878 257/E29.295 |
| 8,421,183 B2 | * | 4/2013 | Ding | H01L 21/76 257/508 |
| 2002/0031897 A1 | * | 3/2002 | Ueda | H01L 21/76264 438/424 |
| 2002/0053717 A1 | * | 5/2002 | Sumida | H01L 21/76264 257/565 |
| 2006/0172494 A1 | * | 8/2006 | Kohlmann-Von Platen | H01L 21/76283 438/270 |
| 2009/0127624 A1 | * | 5/2009 | Sumitomo | H01L 21/76243 257/350 |
| 2012/0261790 A1 | * | 10/2012 | Zhong | H01L 21/76224 257/506 |
| 2012/0292736 A1 | * | 11/2012 | Ebefors | H01L 21/762 257/506 |
| 2013/0205901 A1 | * | 8/2013 | Homeijer | G01P 15/0802 73/514.33 |
| 2013/0292837 A1 | | 11/2013 | Pfennigstorf et al. | |
| 2014/0014986 A1 | * | 1/2014 | Yoshida | H01L 33/62 257/91 |
| 2014/0378804 A1 | * | 12/2014 | Kalvesten | H01L 21/76229 600/373 |
| 2015/0069609 A1 | * | 3/2015 | Farooq | H01L 23/562 257/741 |
| 2016/0276477 A1 | * | 9/2016 | Wada | H01L 29/0696 |

* cited by examiner

SEMICONDUCTOR SUBSTRATE WITH ELECTRICALLY ISOLATING DIELECTRIC PARTITION

CROSS-REFERENCE TO RELATED APPLICATIONS

This application claims the priority under 35 U.S.C. § 119 of European Patent application no. 15200095.6, filed on Dec. 15, 2015, the contents of which are incorporated by reference herein.

BACKGROUND

The present specification relates to a semiconductor device and to a method of making a semiconductor device.

The ongoing miniaturisation of semiconductor devices has led to a need to miniaturise device packages in ways that do not adversely affect the electrical performance of the device.

In the field of discrete devices this trend has led to chip scale packages (CSPs). This type of package generally includes a semiconductor die having a major surface and a backside. Electrical contacts of the device are provided on the major surface. The package may be surface mounted on a carrier such as a printed circuit by placing it on the carrier with the major surface facing downwards. This may allow the contacts on the major surface to be soldered to corresponding contacts on the carrier. Chip scale packages may use little or no mould compound (encapsulant).

Chip scale packages (CSPs), especially flip chip packages, can provide having a relatively large substrate volume with a relatively small package size. In some CSPs, nearly 100% of the package volume is silicon.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a semiconductor device comprising:
 a substrate comprising a major surface and a backside;
 one or more electrical contacts located on the major surface; and
 a dielectric partition for electrically isolating a first part of the substrate from a second part of the substrate, wherein the dielectric partition extends through the substrate from the major surface to the backside.

According to another aspect of the present disclosure, there is provided a method of making a semiconductor device, the method comprising:
 providing a wafer having a major surface and a backside;
 forming a trench that extends from the major surface at least partially through the wafer;
 at least partially filling the trench with dielectric;
 forming a plurality of electrical contacts on the major surface;
 removing material from the backside of the wafer at least until a bottom of the trench is exposed; and
 singulating the wafer to form a plurality of semiconductor substrates, wherein at least one of the substrates includes a dielectric partition formed from the dielectric filled trench, wherein the dielectric partition electrically isolates a first part of the substrate from a second part of the substrate.

The provision of a dielectric partition that extends through the substrate from the major surface to the backside may allow features of the device located in different parts of the substrate to be electrically isolated from each other.

The first part of the substrate may include an active region of the semiconductor device and the second part of the substrate may include a sidewall of the substrate that extends between the major surface and the backside. In this example, the dielectric partition may electrically isolate the sidewall of the substrate from the active region. This may prevent electrical shorting between the active region and any solder that may be used to mount the device, should the solder come into contact with the sidewall. It is envisaged that the part of the substrate including the sidewall may not itself include an active region of the device. In some examples, the part of the substrate including the sidewall may be thin compared to the dimensions of a part of the substrate including an active region (e.g. around 1-3%), thereby allowing the overall size of the device to be reduced.

The first part of the substrate may include a first active region of the semiconductor device and the second part of the substrate may include a second active region of the semiconductor device. In this example, the dielectric partition may be used to electrically isolate the first and second active regions from each other.

The dielectric partition may be shaped to define at least one interlocking portion in the substrate. In some examples the (or each) dielectric partition of the semiconductor device may include a plurality of such interlocking portions.

The interlocking portion(s) may comprise a locking member located on one side of the dielectric partition and an opening located on an opposite side of the dielectric partition. The locking member may be received within the opening to inhibit physical separation of the parts of the substrate that the dielectric partition electrically isolates. The shape of the opening may conform with the shape of the locking member.

In some examples, the locking member of the at least one interlocking portion may include a neck portion and a head portion. The opening may include a mouth portion within which the neck portion of the locking member may be received. The head portion of the locking member may be at least as wide as the mouth portion of the opening when viewed from above the major surface, to prevent removal of the head portion from the opening. In some examples, the head portion of the locking member may be wider than the mouth portion of the opening.

Various different shapes for the locking member are envisaged. For instance, the locking member may be substantially trapezoidal in shape when viewed from above the major surface. In some examples, the edges of the locking member may be curved when viewed from above the major surface.

In some examples, the dielectric partition may include at least one corner when viewed from above the major surface of the substrate. The layout of the dielectric partition, including one or more corners may, for instance, allow the dielectric partition to at least partially surround a part of the substrate.

In some examples, the semiconductor device may comprise at least one further dielectric partition. At least some of the dielectric partitions may intersect. The layout of the dielectric partitions, including one or more intersections may, for instance, allow the dielectric partitions to at least partially surround a part of the substrate.

The substrate may include at least one further part. The first part, the second part and each further part of the substrate may electrically isolated from neighbouring parts by one or more dielectric partitions of the kind described herein. For instance, this may allow multiple active regions of the device to be isolated from each other and/or may allow those active regions to be isolated from the sidewalls of the substrate.

According to a further aspect of the present disclosure, there is provided a chip scale package comprising a semiconductor device of the kind described above.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Figure 1:
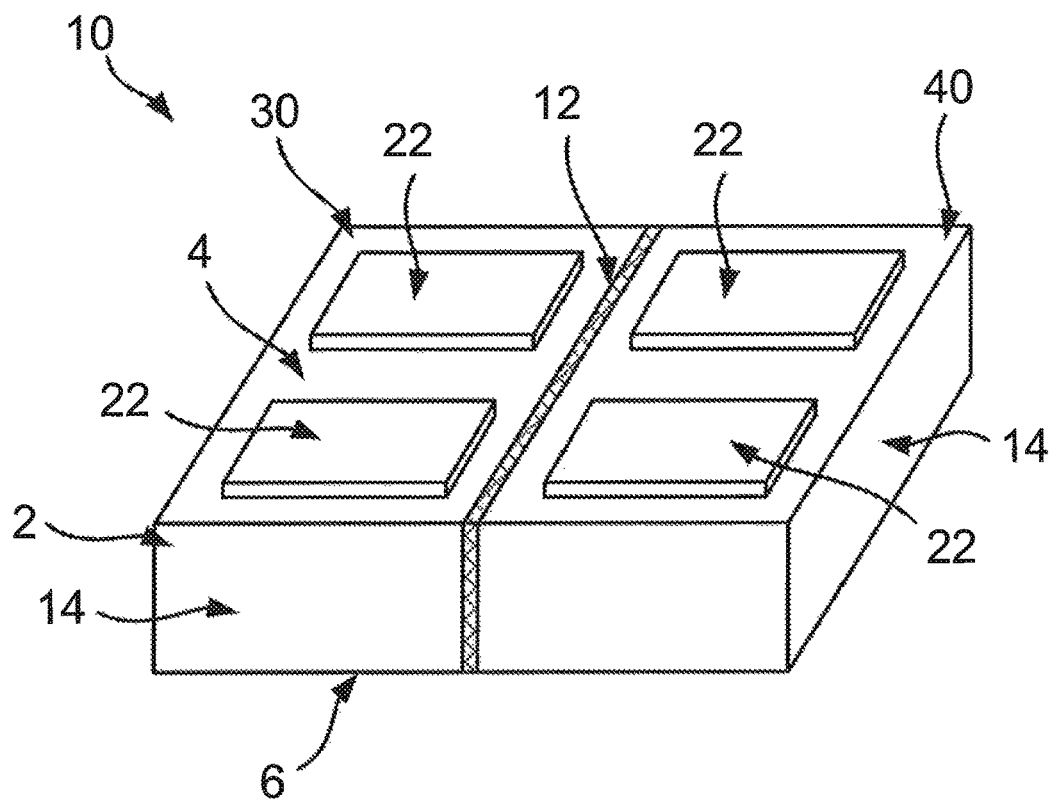
FIG. 1 shows a semiconductor device according to an embodiment of the present disclosure.

FIG. 1 shows a semiconductor device 10 according to an embodiment of this disclosure. The device 10 includes a substrate 2. The substrate 2 may be a semiconductor substrate comprising, for instance, silicon. The substrate 2 has a major surface 4 and a backside 6. The substrate 2 may include a number of sidewalls 14, which extend between the major surface 4 and the backside 6 at the edges of the substrate 2.

The device 10 also includes one or more electrical contacts 22 located on the major surface. The electrical contacts 22 may be metallic. For instance, the contacts 22 may comprise one or may layers of metal stacked on the major surface 4. The contacts 22 may, for instance, formed solder pads for allowing solder to be used to mount and electrically connect the device 10 to a surface of a carrier. Accordingly, the device 10 may be a chip scale package, which may be mountable on a surface of a carrier such as a printed circuit board (PCB).

In this example, the substrate 2 includes a first part 30 and a second part 40. The first part 30 in this example includes an active region including one or more components (e.g. active components such as transistor or diodes), which may be connected to the contacts 22 located in that part. Similarly, the second part 40 in this example includes an active region including one or more components (e.g. active components such as transistor or diodes), which may be connected to the contacts 22 located in that part.

The device 10 also includes a dielectric partition 12. The dielectric partition 12 may extend through the substrate 2 from the major surface 4 to the backside 6 such that the first part 30 of the substrate 2 does not physically contact the second part 40 of the substrate 2. Accordingly, the dielectric partition may electrically isolate the first part 30 of the substrate 2 from the second part 40 of the substrate 2. In the present example, this may allow the active regions in each respective part 30, 40 of the substrate 2 to be electrically isolated from each other. This may, for instance, allow the components in each active region to operate substantially independently from each other, preventing e.g. unwanted cross talk between the components in the different active regions.

Figure 2:
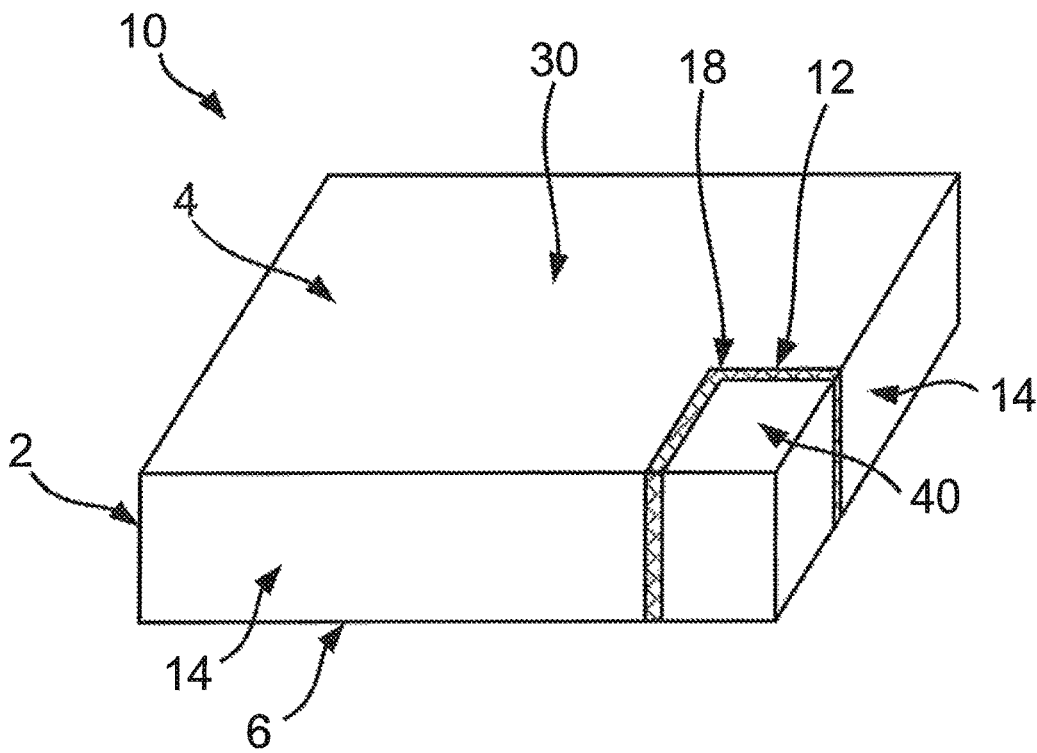
FIG. 2 shows a semiconductor device according to another embodiment of the present disclosure.

FIG. 2 shows a semiconductor device 10 according to another embodiment of this disclosure. The device 10 includes a substrate 2, which as noted previously may be a semiconductor substrate comprising, for instance, silicon. The substrate 2 has a major surface 4 and a backside 6. Like the example of FIG. 1, the substrate 2 may include a number of sidewalls 14, which extend between the major surface 4 and the backside 6 at the edges of the substrate 2.

The substrate 2 in this example includes a first part 30 and a second part 40. As with the example of FIG. 1, the device 10 includes a dielectric partition 12, which may extend through the substrate 2 from the major surface 4 to the backside 6 such that the first part 30 of the substrate 2 does not physically contact the second part 40 of the substrate 2. Accordingly, the dielectric partition may electrically isolate the first part 30 of the substrate 2 from the second part 40 of the substrate 2.

In the example of FIG. 2, the dielectric partition 12 includes a corner 18. The provision of one or more corners 18 in the dielectric partition 12 may allow the layout of the dielectric partition 12 to be determined with greater flexibility compared to the example of FIG. 1. For instance, the dielectric partition 12 in the example of FIG. 2 allows a corner part (the second part 40 in FIG. 2) to be electrically isolated from the remainder of the substrate 2. Each part 30, 40 of the substrate may, for instance, include active regions which may be electrically isolated from each other by the dielectric partition 12 as noted above in relation to FIG. 1.

Figure 3:
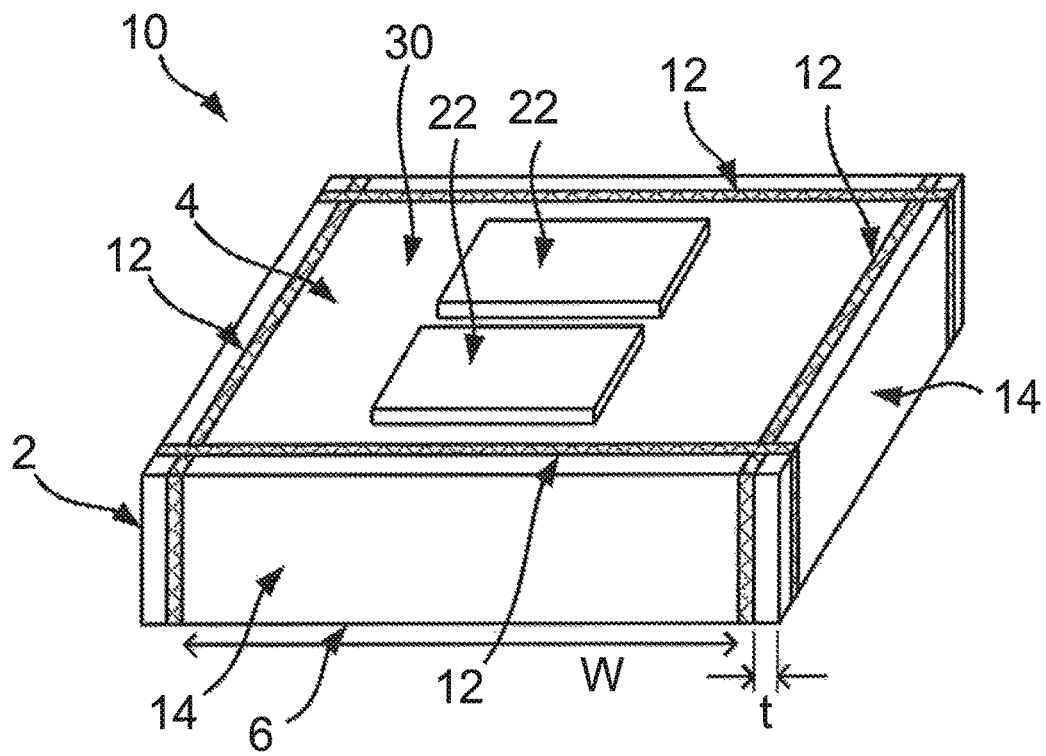
FIG. 3 shows a semiconductor device according to a further embodiment of the present disclosure.

FIG. 3 shows a semiconductor device 10 according to a further embodiment of this disclosure. The device 10 includes a substrate 2, which as noted previously may be a semiconductor substrate comprising, for instance, silicon. The substrate 2 has a major surface 4 and a backside 6. Like the examples of FIG. 1 and FIG. 2, the substrate 2 includes a number of sidewalls 14, which extend between the major surface 4 and the backside 6 at the edges of the substrate 2.

The substrate 2 in this example includes a first part 30 which includes an active region of the kind described previously in relation to FIGS. 1 and 2. One or more contacts 22 of the kind described above in relation to FIG. 1 may be located on the major surface 4 in the first part 30 of the substrate 2.

In this example, the device 10 includes a plurality of dielectric partitions 12. These dielectric partitions 12 intersect with each other at the corners of the first part 30 of the substrate 30 as shown in FIG. 3. As described previously, each dielectric partition 12 may extend through the substrate 2 from the major surface 4 to the backside 6. Each of the dielectric partitions 12 in this example electrically isolates the first part 30 of the substrate 2 from another part of the substrate which includes one of the sidewalls 14. The thickness t of the parts of the substrate 2 including the sidewalls 14 may be thin (e.g. ≈1-3%) compared to the width W of the first part 30 in the same direction. For instance, the parts of the substrate 2 including the sidewalls 14 may be around t≈1-5 μm thick and the width of the first part 30 in the same direction may be a few hundred microns, e.g. around W≈300 μm.

It is envisaged that instead of using multiple intersecting dielectric partitions 12 as shown in FIG. 2, the first part 30 of the substrate 2 may be electrically isolated from the sidewalls 14 of the substrate 2 using a single, box shaped dielectric partition 12 having four corners (of the kind described above in relation to FIG. 2), which surrounds the first part 30 of the substrate 2 on each side.

Figure 4:
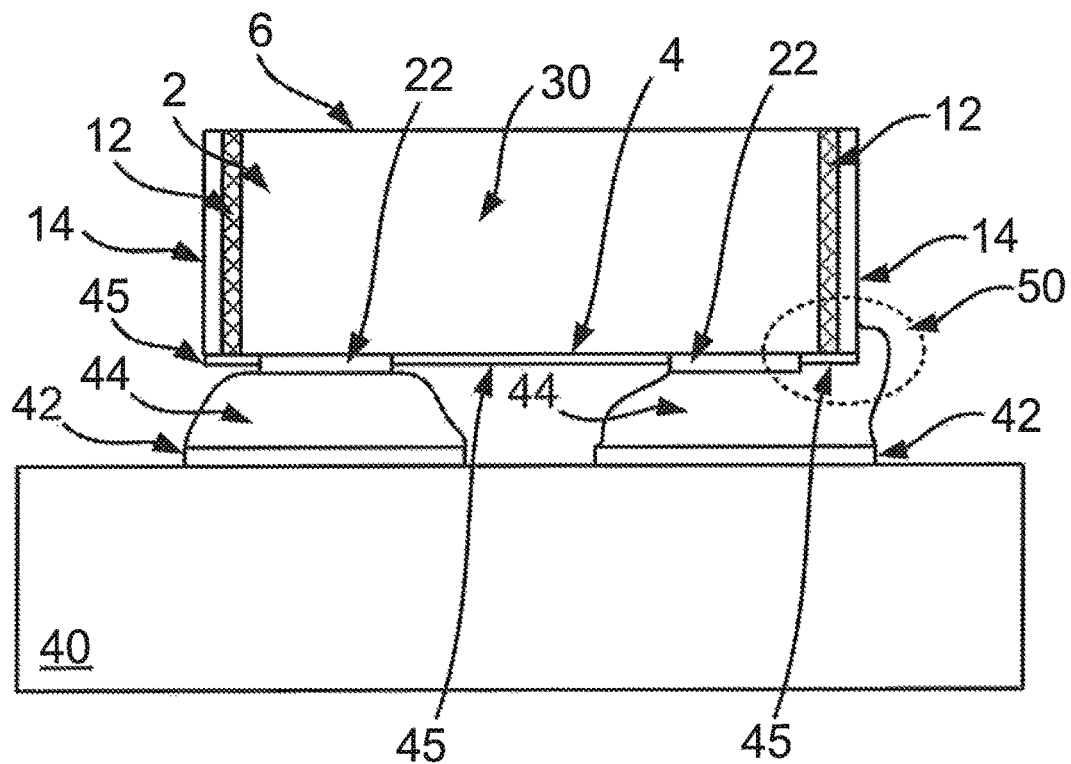
FIG. 4 shows a semiconductor device of the kind shown in FIG. 3 mounted on a carrier such as a printed circuit board (PCB)

FIG. 4 shows the device 10 of FIG. 3 surface mounted, with the major surface 4 facing downwards, on a carrier such as a printed circuit board (PCB). The PCB may include one or may contacts such as solder pads 42 to allow the device to be mounted using portions of solder 44, which provide electrical connections between the carrier and the contacts 22 on the major surface 4. FIG. 4 also shows that in some examples, a protective layer 45 (such as a dielectric) may be located on the major surface 4, thereby to prevent any of the solder 44 that is used to mount the device 10 coming directly into contact with the major surface 4. If the solder 44 did contact the major surface 4 directly, this may cause unwanted electrical shorting between the solder 44 and the device 10 (e.g. to an active region in the first part 30).

As can be seen in FIG. 4, when solder is used to implement this kind of surface mounting, it can occasionally occur that some of the solder 44 may inadvertently make contact with the sidewalls 14 (this is indicated in FIG. 4 by the dotted region labelled using reference numeral 50). Were the sidewalls 14 of the substrate 2 in this example not isolated from the first part 30 including the active region, this may lead to electrical shorting between the contacts 22, 42 and the active region of the device 10 via the part of the solder 44 contacting the sidewall 14, which may lead to incorrect operation of the device 10 or even device failure. Moreover, in the example of FIG. 4, the dielectric partitions 12 may allow each of the different parts of the substrate 2 including a respective sidewall 14 to be isolated from each other, which may prevent electrical shorting between different contacts 22, 42 of the device 10 and/or carrier 40 via the sidewalls, in the event that the solder used to mount the device 10 makes contact with more than one sidewall 14.

It is envisaged that the active region(s) of a device 10 of the kind described in relation to FIG. 4 need not be isolated from all of the sidewalls 14 of the substrate 2. For instance, dielectric partition(s) 12 of the kind shown in FIG. 4 may be provided just to isolated the active regions from sidewalls 14 that relatively close to the contacts 22 on the major surface 4. For sidewalls that are located some distance away from any of the contacts 22, the risk of any solder used to connect to the contacts 22 actually touching the sidewalls 14 may be relatively low. Nevertheless, it will be appreciated that embodiments of this disclosure may allow contacts 22 to be placed relatively close to the edges of the substrate 2 while avoiding the electrical shorting problem noted above, which may allow the overall size of the device 10 to be reduced.

Figure 5A:
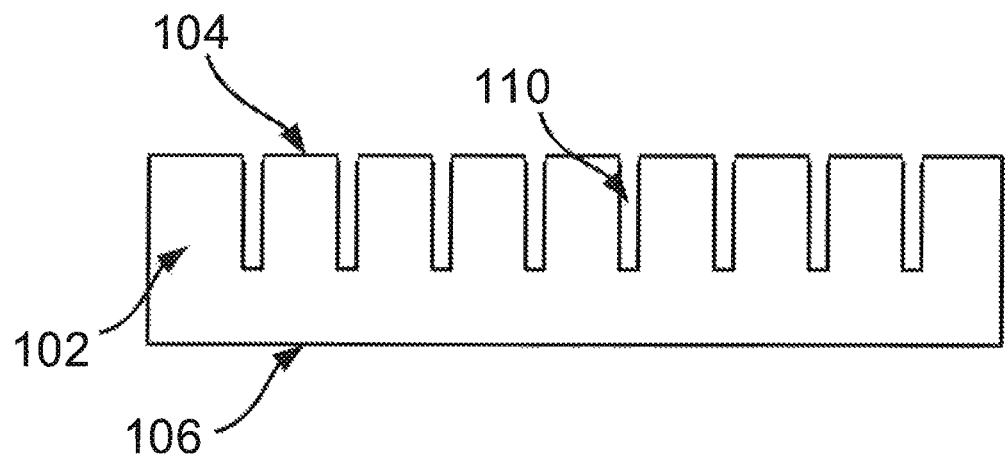
FIGS. 5A-5C show a method for making a semiconductor device in accordance with another embodiment of the present disclosure.
Figure 5B:
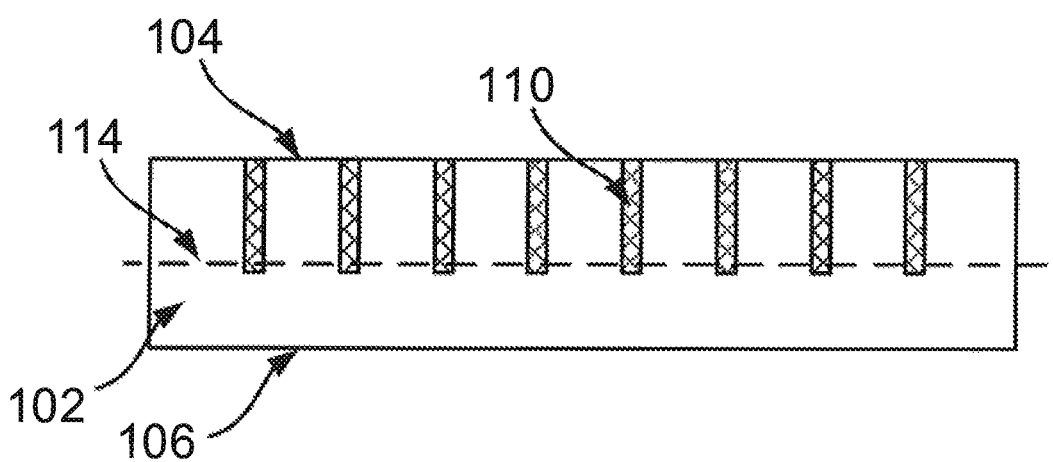
Figure 5C:
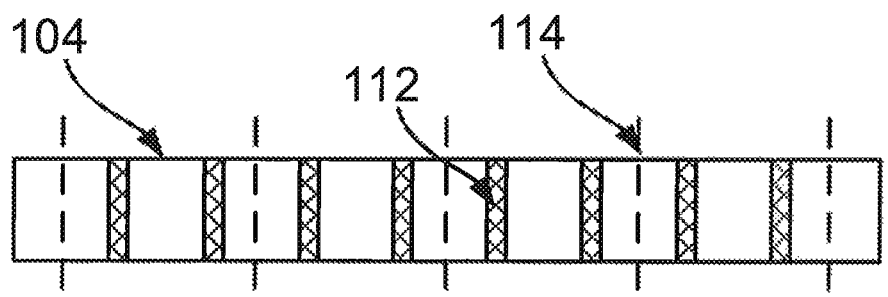

FIGS. 5A-5C show a number of steps in an example of a method for making a semiconductor device in accordance with an embodiment of the present disclosure. In this example, the device is a wafer-level chip scale package (WLCSP).

In a first step shown in FIG. 5A, a wafer 102 is provided. The wafer 102 may be a semiconductor wafer comprising, e.g. silicon. The wafer 102 has a major surface 104 and a backside 106. One or more active regions may be formed in the wafer 102 using standard semiconductor manufacturing techniques and one or more contacts may be formed on the major surface 104 of the wafer 102 to provide electrical connections to these active regions. It is envisaged that the active regions and/or the contacts on the major surface may be formed either prior to or after the formation of the trenches and corresponding dielectric partitions to be described below. For clarity, the active regions and contacts are not shown in FIGS. 5A-5C.

At least one trench 110 is formed in the wafer 102. The trench(es) 110 may, for instance, be formed using lithographic techniques in which the major surface is masked and etched. In another example, laser etching may be used. The trench(es) 110 extend from the major surface 104 at least partially through the wafer 102. As represented by the dashed line 114 in FIG. 5B, the depth of the trench(es) may be chosen to be substantially equal to, or deeper than, the thickness of the wafer after the back grinding step described below.

In a next step shown in FIG. 5B, the trench(es) are at least partially filled with dielectric. The dielectric may be formed, for instance, by:

Filling the trench(es) with (Low Pressure Chemical Vapor Deposition (LPCVD)) deposited oxide;
thermal oxidation the sidewalls of the trench(es), and filling the remainder of the trench(es) with undoped LPCVD polysilicon; or
Using polyimide or a similar spin-on polymer.

The choice of methods and materials at least partially filling the trench(es) may depend, for instance, on the width of the trench(es).

In the present example, the trench(es) 110 are completely filled with dielectric. It will be appreciated that the layout of the trench(es) 110 formed in FIG. 5A may be chosen such that, following singulation of the wafer as described below, the trench(es) 110 filled with dielectric form the dielectric partitions 112 of the kind described herein.

After the trench(es) 110 have been at least partially filled with dielectric, material may be removed from the backside 106 of the wafer 102, e.g. by back-grinding the wafer 102. This material may be removed at least until the bottoms of the trench(es) 110 are exposed. As can be seen in FIG. 5C, this results in the formation of one or more dielectric partitions 12 corresponding to the trenches 110 filled with dielectric.

In a next step, represented by the dashed lines 114 in FIG. 5C, the wafer may be singulated (diced) to form a plurality of semiconductor substrates. Each substrate may be a substrate of a semiconductor device of the kind described herein. Note that the major surface of the substrates may correspond to the major surface 104 of the wafer 102, while the backside of each substrate may correspond to the back grinded backside 106 of the wafer 102.

Figure 6:
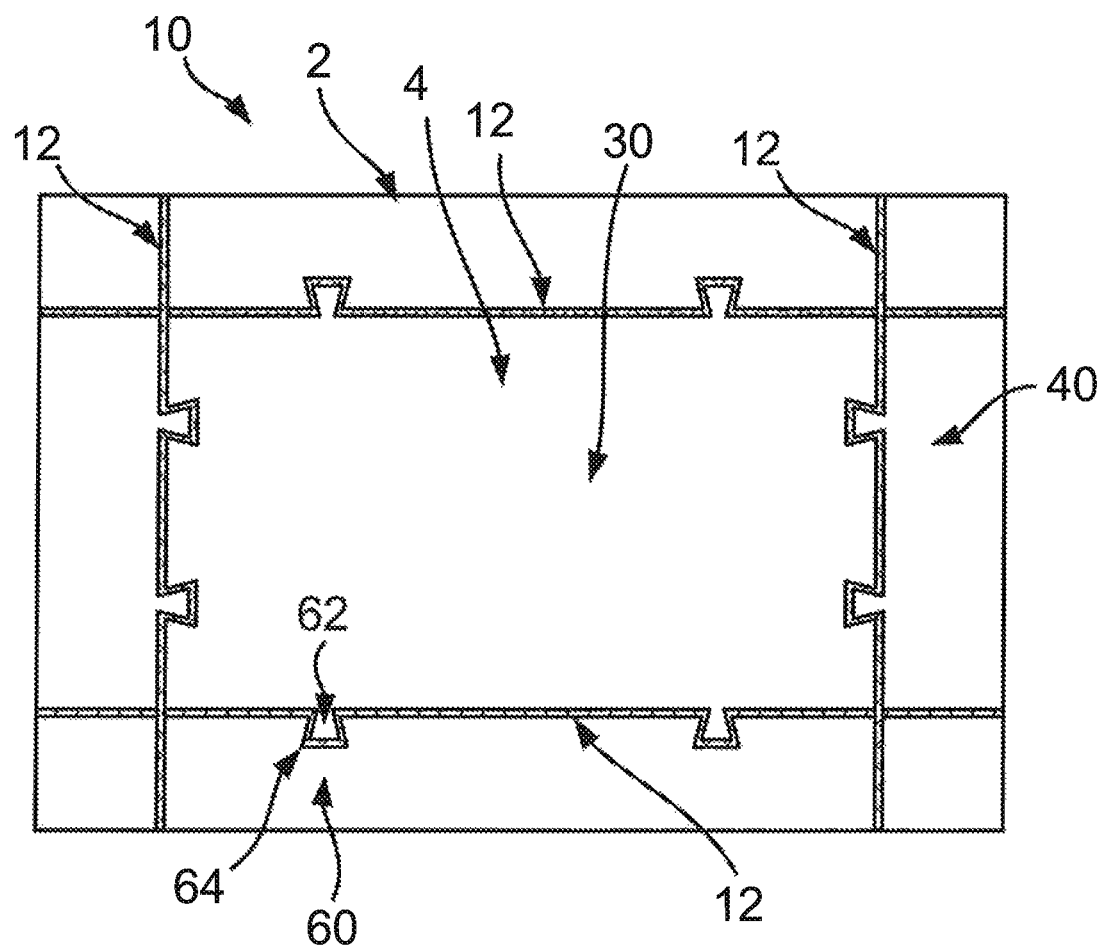
FIG. 6 shows a semiconductor device according to a further embodiment of the present disclosure.

FIG. 6 shows a semiconductor device 10 according to a further embodiment of the present disclosure. The device 10 includes a substrate 2, which as noted previously may be a semiconductor substrate comprising, for instance, silicon. The substrate 2 has a major surface 4 and a backside. Like the example of FIG. 1, the substrate 2 may include a number of sidewalls, which extend between the major surface 4 and the backside at the edges of the substrate 2. The view of the device 10 in FIG. 6 is from above the major surface 4, and as such the backside and sidewalls are not visible.

The substrate 2 in this example includes a first part 30, which may include an active region of the device 10. The substrate includes a number of other parts, such as second part 40, which includes one of the sidewalls of the substrate 2. In other examples, the second part 40 may include another active region of the device, as explained previously in relation to FIG. 1.

The device 10 includes a number of dielectric partitions 12 which may extend through the substrate 2 from the major surface 4 to the backside as explained previously. In the present example, the device 10 includes four dielectric partitions 12, which intersect in a number of locations and which electrically isolate the first part 30 of the substrate 2 from parts of the substrate 2 (such as the second part 40) which include sidewalls of the substrate 2. The layout of the dielectric partitions 12 in this example is therefore similar to that described in relation to FIG. 3.

In accordance with embodiments of this disclosure, at least some of the dielectric partitions 12 may be shaped to define at least one interlocking portion in the substrate 2. These interlocking portions may each comprise a locking member 62 located on one side of the dielectric partition 12 and an opening 64 located on an opposite side of the dielectric partition 12. The locking member 62 may be received within the opening 64. Each opening 64 may be shaped to conform with the shape of the locking member 62 received within it.

As will be described below in more detail, the locking member 62 may be shaped to oppose its removal from the opening 64. The interlocking portion may thus improve the mechanical robustness of the device 10 by inhibiting physical separation of the parts of the substrate 2 that the dielectric partition 12 electrically isolates. The provision of interlocking portions of the kind described herein may thus address the potential structural weakness introduced into the substrate 2 by the presence of the dielectric partitions 12.

In the present example, each dielectric partition 12 includes two such interlocking regions, as can be seen in FIG. 6. The locking members 62 may be oriented to extend substantially transverse to the direction in which the dielectric partition 12 itself extends. It will be appreciated that the locking members 62 may be located on either side of the dielectric partition 12, and the openings 64 may be provided on the opposite side of the dielectric partition 12 to receive the locking members 62. For instance, in the example of FIG. 6, some of the locking members 62 extend outwardly with respect to the first part 30 of the substrate 2, while others of the locking members 62 extend inwardly with respect to the first part 30 of the substrate 2.

In the example of FIG. 6, the interlocking portions 60 of each dielectric partition 12 are separated by intervening straight sections of the dielectric partition 12. The interlocking portions 60 may be located at regular intervals along the or each dielectric partition 12. The spacing between adjacent interlocking portions 60 may be determined by the length of the dielectric partition 12 and the number of interlocking portions 60 that it includes. It is envisaged that the spacing between adjacent interlocking portions 60 may vary over the length of the dielectric partition 12.

Figure 7:
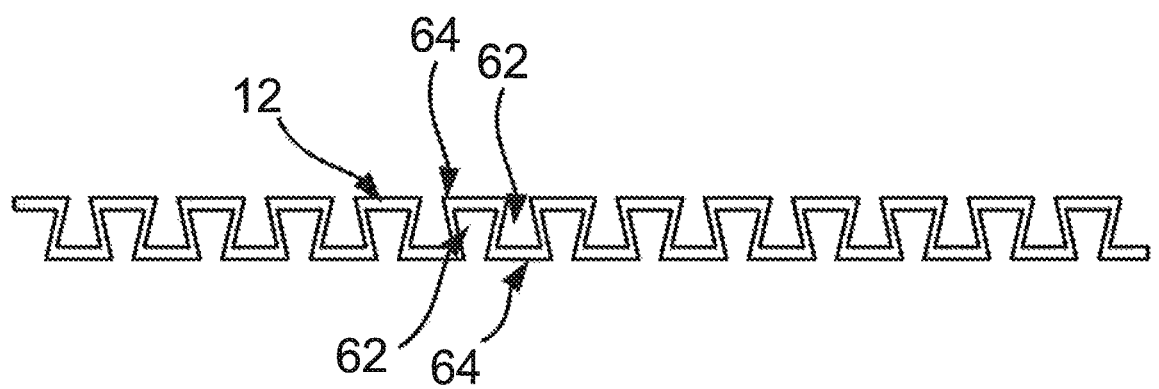
FIG. 7 shows a dielectric partition having a plurality of interlocking portions in accordance with an embodiment of the present disclosure.

In the example of FIG. 7, a dielectric partition 12 includes a plurality of interlocking portions 60 which are located adjacent each other along the dielectric partition 12. In this example, since the interlocking portions 60 are located adjacent each other, they are not separated by straight sections of the kind described above. It is envisaged though that in some examples, a dielectric partition 12 may be provided with one or more groups of adjacent interlocking portions 60 of the kind shown in FIG. 7, with each group being separated by one or more straight sections.

In the example of FIG. 7, note that the locking members 62 of adjacent interlocking portions 60 are located on opposite sides of the dielectric partition 12, and that correspondingly the openings 64 of adjacent interlocking portions 60 are also located on opposite sides of the dielectric partition 12.

Figure 8:
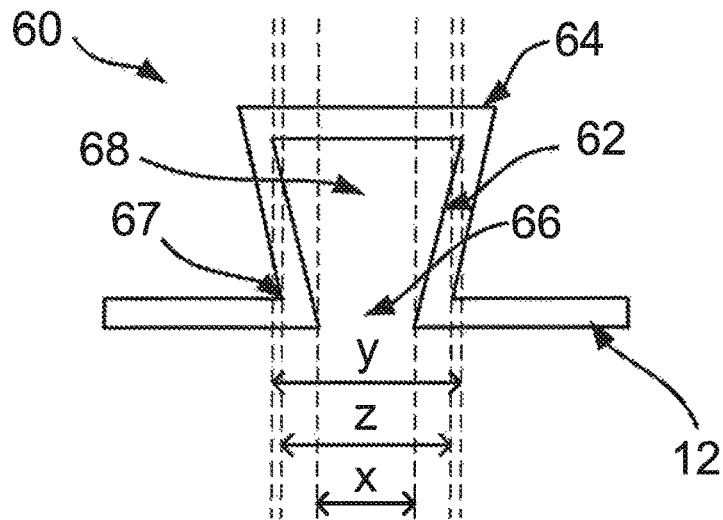
FIG. 8 shows an interlocking portion of the kind shown in FIGS. 6 and 7 in more detail.

FIG. 8 shows an interlocking portion 60 of the kind shown in FIGS. 6 and 7 in more detail. In this example, the locking member 62 includes a neck portion 66 and a head portion 68. At its widest point (denoted dimension "X" in FIG. 8), the head portion 68 is wider than the narrowest part of the neck portion 66 (denoted dimension "Y" in FIG. 8) when viewed from above the major surface of the substrate. The opening includes a mouth portion 67, which may typically be the narrowest part of the opening 64. As shown in FIG. 8, the neck portion of the locking member 62 may be located in the mouth portion 67 of the opening 64.

The shape of the neck portion 66, head portion 68 and mouth portion 67 may assist in retaining the locking member 62 within the opening 64. For instance, the widest point of the head portion 68 may be at least as wide as (or in some examples, as in FIG. 8, wider than) the width of the mouth portion 67 of the opening 64 (denoted dimension "Z" in FIG. 8) when viewed from above the major surface of the substrate.

It is envisaged that the dimensions of the features of the interlocking portions 60 in a given device 10 may not be equal. For instance, larger locking members 62 may be used in certain parts of the device 10, where it is envisaged that greater mechanical strength may be needed.

In the example of FIG. 8, the locking member 62 is substantially trapezoidal in shape when viewed from above the major surface. Since the shape of opening 64 in this example conforms to the shape of the locking member 62, the opening itself is also substantially trapezoidal in shape when viewed from above the major surface. However, it is envisaged that the locking member 62 and/or the opening 64 may have an alternative shape. Some further examples are described below in relation to FIGS. 9A-9C.

In some examples (includes those shown in FIGS. 9A-9C), the locking member may have edges that are curved when viewed from above the major surface.

Figure 9A:
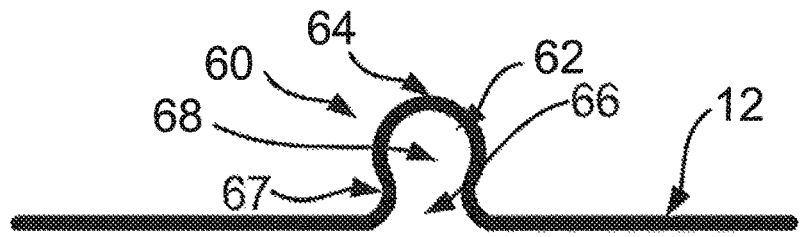
FIGS. 9A-9C each show further examples of a dielectric partition for a semiconductor device in accordance with an embodiment of the present disclosure.

The dielectric partition 12 shown in FIG. 9A forms an interlocking portion 60 which has a substantially circular head portion 68. At its widest point (which may be considered to be the diameter of the substantially circular head portion 68 in this example), the head portion 68 is wider than the narrowest part of the neck portion 66 when viewed from above the major surface of the substrate. Since the shape of the opening 64 confirms with the shape of the head portion 62, the shape of the opening 64 in this example is also substantially circular. In this example also, the widest point of the head portion 68 may be at least as wide as (or in some examples, wider than) the width of the mouth portion 67 of the opening 64, to assist in retaining the locking member 62 within the opening 64.

Figure 9B:
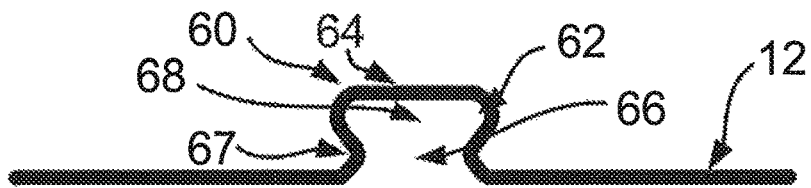

The dielectric partition 12 shown in FIG. 9B forms an interlocking portion 60 which has a locking member 62 with head portion 68 having a substantially flat top part and a pinched neck portion 66 (resembling the shape of an hourglass). The shape of the opening 64 is similar to that of the head portion 62 in this example. At its widest point, the head portion 68 is wider than the narrowest part of the pinched neck portion 66 when viewed from above the major surface of the substrate. In this example also, the widest point of the head portion 68 may be at least as wide as (or in some examples, wider than) the width of the mouth portion 67 of the opening 64, to assist in retaining the locking member 62 within the opening 64.

Figure 9C:

The dielectric partition 12 shown in FIG. 9C forms an interlocking portion 60 which has a locking member 62 which is shaped similarly to that shown in FIG. 9B, with the exception that instead of having a substantially flat top part, the locking member 62 has a concave top part. This may increase the surface area of the locking member 62, which may improve the mechanical strength of the interlocking portion 60. Again, the shape of the opening 64 in this example conforms with that of the head portion 62. At its widest point, the head portion 68 is wider than the narrowest part of the pinched neck portion 66 when viewed from above the major surface of the substrate. In this example also, the widest point of the head portion 68 may be at least as wide as (or in some examples, wider than) the width of the mouth portion 67 of the opening 64, to assist in retaining the locking member 62 within the opening 64.

It is envisaged that a given device 10 of the kind described herein need not include interlocking portions 60 all having the same size and/or shape. For instance, a given device 10 may include interlocking portions 60 having a mixture of shapes of the kind described in relation to FIGS. 8 and 9A-9C.

With reference to the method described in relation to FIGS. 5A-5C, it will be appreciated that the locking portions 60 described herein may be formed by appropriate shaping of the trench(es) 110 shown in FIG. 5A. As mentioned previously, the trench(es) 110 may be formed lithographically, or may be for instance be formed by laser etching. Either of these techniques would be suitable for appropriately shaping the trench(es) 110 so that filling of the trench(es) 110 with dielectric as shown in FIG. 5B and singulation of the wafer 102 as shown in FIG. 5C may result in a device 10 having dielectric partition(s) 12 with interlocking portion(s) 60 of the kind described above.

Accordingly, there has been described a semiconductor device and a method of making the same. The device includes a substrate comprising a major surface and a backside. The device also includes a dielectric partition for electrically isolating a first part of the substrate from a second part of the substrate. The dielectric partition extends through the substrate from the major surface to the backside.

Although particular embodiments of this disclosure have been described, it will be appreciated that many modifications/additions and/or substitutions may be made within the scope of the claims.

The invention claimed is:

1. A semiconductor device comprising:
   a semiconductor substrate of the semiconductor device comprising a major surface and a backside;
   one or more electrical contacts located on the major surface;
   a first part of the semiconductor substrate and including an active region of the semiconductor device;
   a second part of the semiconductor substrate and including an external sidewall of the semiconductor substrate of the semiconductor device that extends between the major surface and the backside;
   a dielectric partition for electrically isolating the first part of the semiconductor substrate from the second part of the semiconductor substrate, wherein the dielectric partition extends through the semiconductor substrate from the major surface to the backside and exposes a portion of the external sidewall to isolate the external sidewall of the second part of the semiconductor substrate from the first part, wherein the dielectric partition extends through adjacent portions of the external sidewall to form an exposed corner of the semiconductor substrate of the semiconductor device, wherein the exposed corner is electrically isolated from the first part of the semiconductor device, and
   wherein the semiconductor device is for a chip scale package.

2. The semiconductor device of claim 1, wherein the first part of the semiconductor substrate includes a first active region of the semiconductor device and wherein the second part of the semiconductor substrate includes a second active region of the semiconductor device.

3. The semiconductor device of claim 1, wherein the dielectric partition is shaped to define at least one interlocking portion in the semiconductor substrate, wherein the interlocking portion comprises a locking member located on one side of the dielectric partition and an opening located on an opposite side of the dielectric partition, wherein the locking member is received within the opening to inhibit physical separation of the first and second parts of the semiconductor substrate that the dielectric partition electrically isolates.

4. The semiconductor device of claim 3, wherein the locking member of the at least one interlocking portion includes a neck portion and a head portion, wherein the opening includes a mouth portion within which the neck portion of the locking member is received, and wherein the head portion of the locking member is at least as wide as the mouth portion of the opening when viewed from above the major surface, to prevent removal of the head portion from the opening.

5. The semiconductor device of claim 4, wherein the locking member is trapezoidal in shape when viewed from above the major surface.

6. The semiconductor device of claim 3, wherein edges of the locking member are curved when viewed from above the major surface.

7. The semiconductor device of claim 3, wherein the dielectric partition includes a plurality of the interlocking portions.

8. The semiconductor device of claim 1, wherein the semiconductor substrate includes at least one further part, and wherein the first part, the second part and each further part of the semiconductor substrate are electrically isolated from neighboring parts by one or more of the dielectric partitions.

9. A chip scale package comprising the semiconductor device of claim 1.

10. A chip-scale package (CSP) semiconductor device comprising:
    a semiconductor substrate of the CSP semiconductor device comprising a mayor surface and a backside;
    one or more electrical contacts located on the major surface:
    a first part of the semiconductor substrate and including an active region of the CSP semiconductor device;
    a second part of the semiconductor substrate and including an external sidewall of the semiconductor substrate of the CSP semiconductor device that extends between the major surface and the backside; and
    a plurality of dielectric partitions comprising
       a dielectric partition for electrically isolating the first part of the semiconductor substrate from the second part of the semiconductor substrate, wherein the dielectric partition extends through the semiconductor substrate from the major surface to the backside and exposes a portion of the external sidewall to isolate the external sidewall of the second part of the semiconductor substrate from the first part and at least one further dielectric partition, wherein at least some dielectric partitions of the plurality of dielectric partitions of the CSP semiconductor device intersect, wherein the first part of the semiconductor substrate is electrically isolated from the second part of the semiconductor substrate.

11. A method of making a semiconductor device, the method comprising:

providing a wafer having a major surface and a backside;

forming a trench that extends from the major surface at least partially through the wafer;

at least partially filling the trench with dielectric;

forming a plurality of electrical contacts on the major surface;

removing material from the backside of the wafer at least until a bottom of the trench is exposed; and singulating the wafer to form a plurality of semiconductor substrates, wherein each of the semiconductor substrates includes one or more of the electrical contacts, wherein at least one semiconductor substrate of the plurality of semiconductor substrates includes a dielectric partition formed from the dielectric filled trench, wherein the dielectric partition electrically isolates a first part of the semiconductor substrate from a second part of the semiconductor substrate, wherein the first part of the semiconductor substrate includes an active region of the semiconductor device and wherein the second part of the substrate includes an external sidewall of the semiconductor substrate that extends between a major surface and a backside of the semiconductor substrate corresponding to the major surface and backside of the wafer, and wherein the dielectric partition extends through the semiconductor substrate from the major surface to the backside and exposes a portion of the external sidewall to isolate the external sidewall of the second part of the semiconductor substrate from the first parts wherein the dielectric partition extends through adjacent portions of the external sidewall to form an exposed corner of the semiconductor substrate of the semiconductor device, wherein the exposed corner is electrically isolated from the first part of the semiconductor device, and wherein the semiconductor device is for a chip scale package.

12. The method of claim 11, wherein the dielectric partition is shaped to define at least one interlocking portion in the semiconductor substrate, wherein the interlocking portion comprises a locking member located on one side of the dielectric partition and an opening located on an opposite side of the dielectric partition, wherein the locking member is received within the opening to inhibit physical separation of the parts of the semiconductor substrate that the dielectric partition electrically isolates.

* * * * *